(12) United States Patent
Liu et al.

(10) Patent No.: US 8,228,154 B2
(45) Date of Patent: Jul. 24, 2012

(54) MINIATURIZED WIDE-BAND BALUNS FOR RF APPLICATIONS

(75) Inventors: Kai Liu, Phoenix, AZ (US); Robert Charles Frye, Piscataway, NJ (US)

(73) Assignee: STATS ChipPAC, Ltd., Singapore (SG)

( * ) Notice: Subject to any disclaimer, the term of this patent is extended or adjusted under 35 U.S.C. 154(b) by 1 day.

(21) Appl. No.: 12/579,307

(22) Filed: Oct. 14, 2009

(65) Prior Publication Data
US 2010/0033290 A1 Feb. 11, 2010

Related U.S. Application Data

(62) Division of application No. 11/760,207, filed on Jun. 8, 2007, now Pat. No. 7,629,860.

(51) Int. Cl.
*H01F 5/00* (2006.01)
*H01F 27/28* (2006.01)
*H01F 7/06* (2006.01)

(52) U.S. Cl. ........ 336/170; 336/200; 336/222; 29/602.1

(58) Field of Classification Search .................. 336/200, 336/222, 223, 145, 146, 170; 29/602.1
See application file for complete search history.

(56) References Cited

U.S. PATENT DOCUMENTS

| | | | | |
|---|---|---|---|---|
| 4,901,048 A | * | 2/1990 | Williamson | 336/180 |
| 5,521,573 A | * | 5/1996 | Inoh et al. | 336/180 |
| 5,697,088 A | | 12/1997 | Gu | |
| 6,087,922 A | * | 7/2000 | Smith | 336/223 |
| 6,304,164 B1 | * | 10/2001 | Ohno et al. | 336/200 |
| 6,515,556 B1 | | 2/2003 | Kato et al. | |
| 6,683,510 B1 | * | 1/2004 | Padilla | 333/25 |
| 6,696,911 B2 | * | 2/2004 | Tomohiro et al. | 336/200 |
| 6,737,930 B2 | | 5/2004 | Toncich | |
| 7,026,903 B2 | * | 4/2006 | Hsu et al. | 336/200 |
| 7,042,303 B2 | | 5/2006 | Anthony et al. | |

(Continued)

FOREIGN PATENT DOCUMENTS
WO 2005076404 A1 8/2005

OTHER PUBLICATIONS

Chen et al., "Novel Broadband Planar Balun Using Multiple Coupled Lines," Information and Communications Research Laboratories, Industrial Technology Research Institute, Hsinchu 310, Taiwan, IEEE IMS Digest, pp. 1571-1574, Jun. 2006.

*Primary Examiner* — Mohamad Musleh
*Assistant Examiner* — Mangtin Lian
(74) *Attorney, Agent, or Firm* — Robert D. Atkins; Patent Law Group: Atkins & Associates, P.C.

(57) ABSTRACT

A wide-band balun device includes a first metallization deposited over a substrate and oriented in a first coil. The first coil extends horizontally across the substrate while maintaining a substantially flat vertical profile. A second metallization is deposited over the substrate and oriented in a second coil. The second coil is magnetically coupled to the first coil and a portion of the second coil oriented interiorly of the first coil. A third metallization is deposited over the substrate and oriented in a third coil. The third coil is magnetically coupled to the first and second coils. A first portion of the third coil is oriented interiorly of the second coil. The third coil has a balanced port connected to the third coil between second and third portions of the third coil.

34 Claims, 9 Drawing Sheets

U.S. PATENT DOCUMENTS

| | | |
|---|---|---|
| 7,199,679 B2 | 4/2007 | Mondal |
| 7,327,131 B2 * | 2/2008 | Ezzeddine .................... 323/355 |
| 7,397,328 B2 | 7/2008 | Yasuda et al. |
| 7,468,640 B2 | 12/2008 | Nosaka |
| 7,629,860 B2 | 12/2009 | Liu et al. |
| 2001/0040495 A1 * | 11/2001 | Morikawa ..................... 336/223 |
| 2007/0120637 A1 * | 5/2007 | Ezzeddine .................... 336/200 |
| 2007/0176727 A1 * | 8/2007 | Chen et al. .................... 336/232 |

* cited by examiner

MINIATURIZED WIDE-BAND BALUNS FOR RF APPLICATIONS

CLAIM TO DOMESTIC PRIORITY

The present application is a division of U.S. patent application Ser. No. 11/760,207, filed Jun. 8, 2007, and claims priority to the foregoing parent application pursuant to 35 U.S.C. §120.

FIELD OF THE INVENTION

The present invention relates in general to electronic devices and, more particularly, to compact balun structures used in wide-band radio frequency (RF) applications.

BACKGROUND OF THE INVENTION

Electrical components, such as inductors, capacitors, computer chips, and the like, are increasingly in demand for a broad range of applications. Along with the increased overall need for these components, there is a drive to make the components more miniaturized in size and footprint. Smaller electrical components carry through to smaller electrical devices, such as telephones and portable music player devices.

Electrical devices known as baluns are typically used to convert unbalanced electrical signals to balanced signals. A balun that operates in a low frequency band and is used to connect a balanced transmission line to an unbalanced line generally consists of a concentrated constant component such as a transformer, whereas a balun that operates in a high-frequency microwave band consists of a distributed constant component. Baluns known in the art consist of a distributed constant component, including a quarter-wavelength matching element, or include transformers having a size determined according to usable wavelengths.

Because baluns incorporating a distributed line topology necessarily include the requirement of the length of the respective "line" to be in the order of one-fourth of the wavelength at the operating frequency, line length requirements limit low frequency applications. Transformer characteristics also limit allowable frequencies. As a result, a major disadvantage to conventional balun designs is that respective frequency bands are fundamentally narrow.

A need exists for a balun device that realizes a compact design yet is usable in a wide band of frequency applications. The design would benefit from compatibility with existing semiconductor technologies that allow for integration of electrical components in semiconductor devices.

SUMMARY OF THE INVENTION

Accordingly, in one embodiment, the present invention is a wide-band balun device comprising a first coil formed over a substrate in a wound configuration having a substantially flat profile. A second coil is formed in a wound configuration adjacent to the first coil. The second coil is magnetically coupled to the first coil. A third coil is formed in a wound configuration adjacent to the second coil. The third coil is magnetically coupled to the second coil. The first, second, and third coils are respectively disposed on first, second, and third levels of the substrate.

In another embodiment, the present invention is a balun device comprising a first coil formed over a substrate in a wound configuration, and second coil formed in a wound configuration adjacent to the first coil. The second coil is magnetically coupled to the first coil. The first and second coils are disposed on different levels of the substrate.

In another embodiment, the present invention is a balun for a semiconductor device comprising a first metallization formed over a substrate and patterned as a first coil. A second metallization is formed as a second coil adjacent to the first coil. The second metallization is magnetically coupled to the first metallization. The first and second metallizations are disposed on different levels of the substrate.

In another embodiment, the present invention is a method of manufacturing a balun comprising the steps of forming a first metallization over a substrate patterned as a first coil, and forming a second metallization as a second coil adjacent to the first coil. The second metallization is magnetically coupled to the first metallization. The method further includes the step of disposing the first and second metallizations on different levels of the substrate.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
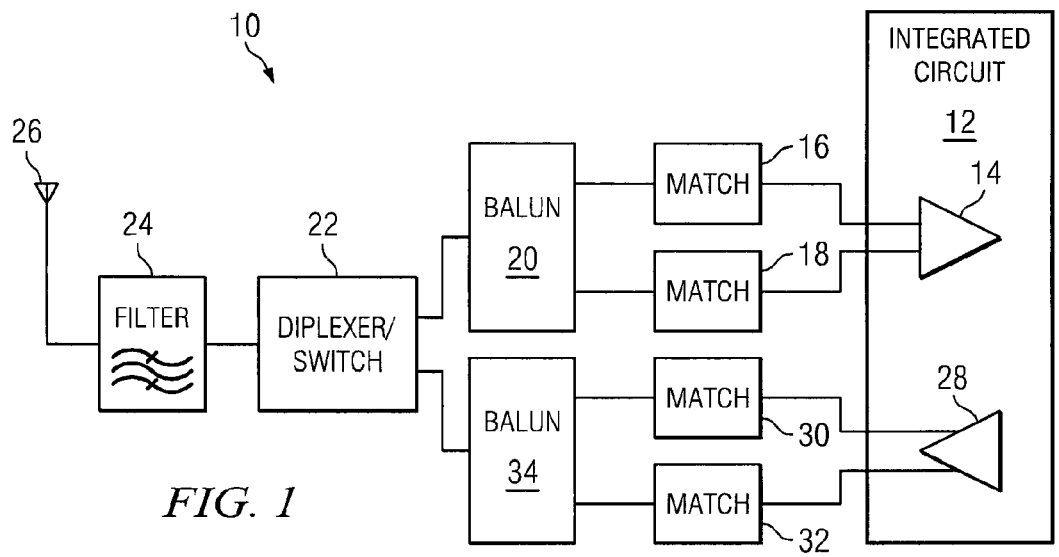
FIG. 1 illustrates an exemplary balun implementation.

Turning to FIG. 1, an exemplary balun implementation 10 for a wireless device is depicted. The device includes an integrated circuit (IC) having a low noise amplifier (LNA) 14 associated with a receiver portion of the device. LNA 14 is coupled to matching circuits 16 and 18 for the respective legs of the LNA 14. Matching circuits 16 and 18 are coupled to balun device 20 as shown. Balun device 20 serves to convert an unbalanced input to a balanced output, as previously described. Balun 20 is coupled to diplexer/switching device 22 to route input/output (I/O) signals through a filter device 24, and finally, to an antenna 26.

Similarly, incorporated into the transmitting portion of the device is a power amplifier (PA) device 28, which is also connected to a matching circuit 30 and 32 for each respective leg. The matching circuits 30 and 32 are connected to balun 34. Again, balun 34 is coupled to diplexer/switcher 22, which is coupled through filter device 24 to antenna 26.

Figure 2A:
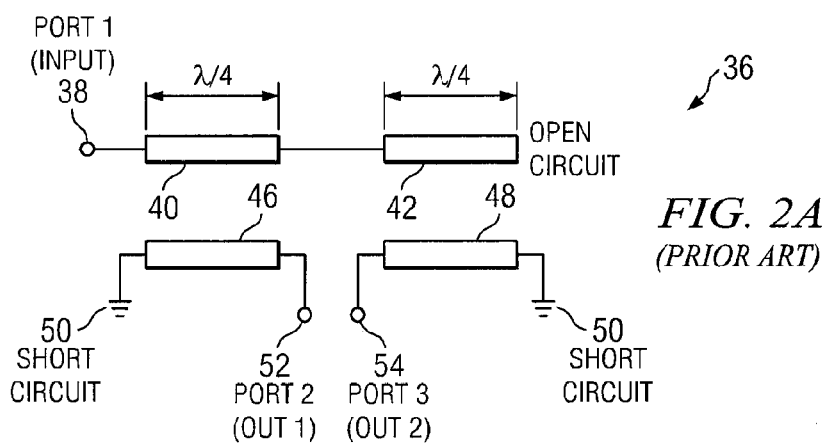
FIG. 2A illustrates an exemplary prior art balun design incorporating a distributed constant component.

FIG. 2A illustrates an exemplary shunt transmission line balun device 36. The balun device 36 is a three port device. An input 38, is connected to a length of transmission "line" 40, and a second length of transmission line 42, ending with an open circuit. Lines 46 and 48 are coupled to ground 50 as shown, and coupled to output ports 52 and 54. Device 36 illustrates the conventional use of distributed constant components, including quarter-wavelength matching elements (i.e., lines 40 and 42). As previously described, the use of quarter-wavelength elements have accompanying limitations in lower frequency applications due to the physical constraints of the device requiring greater line lengths.

Figure 2B:
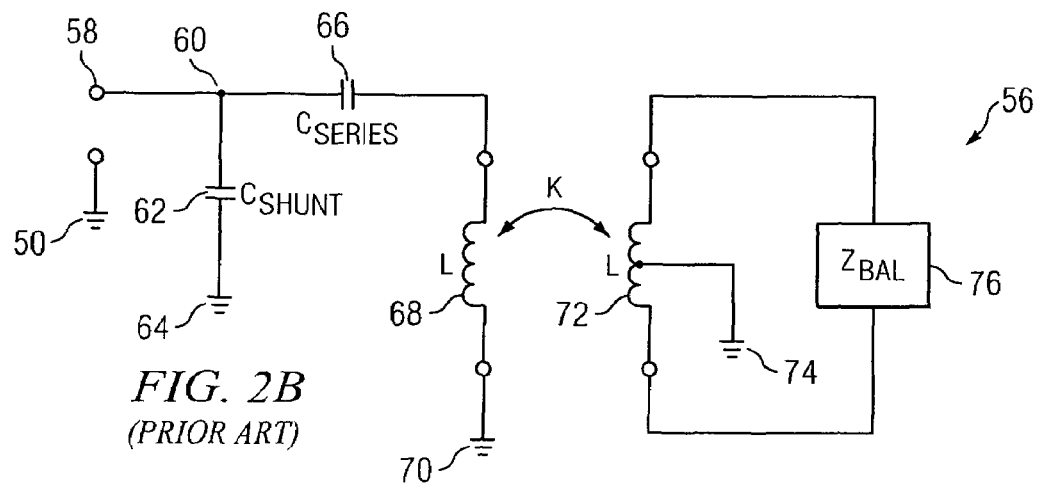
FIG. 2B illustrates a schematic diagram of an additional exemplary prior art balun implementation incorporating a capacitor device shunted to ground.

Turning to FIG. 2B, an additional exemplary schematic 56 of a balun implementation 56 is shown in a so-called "transformer" implementation. Balun 56 includes an input port 58. A shunting capacitor 62 is coupled between ground 64 and node 60. A series capacitor is coupled between node 60 and a primary inductor coil 68 which is coupled to ground 70. Secondary inductor coil 72 is coupled to ground 74 at a center tap. An impedance load (denoted Zbal) 76, such as a LNA 76, a PA 76, or a similar active device 76 is connected across the secondary transformer 72.

Figure 2C:
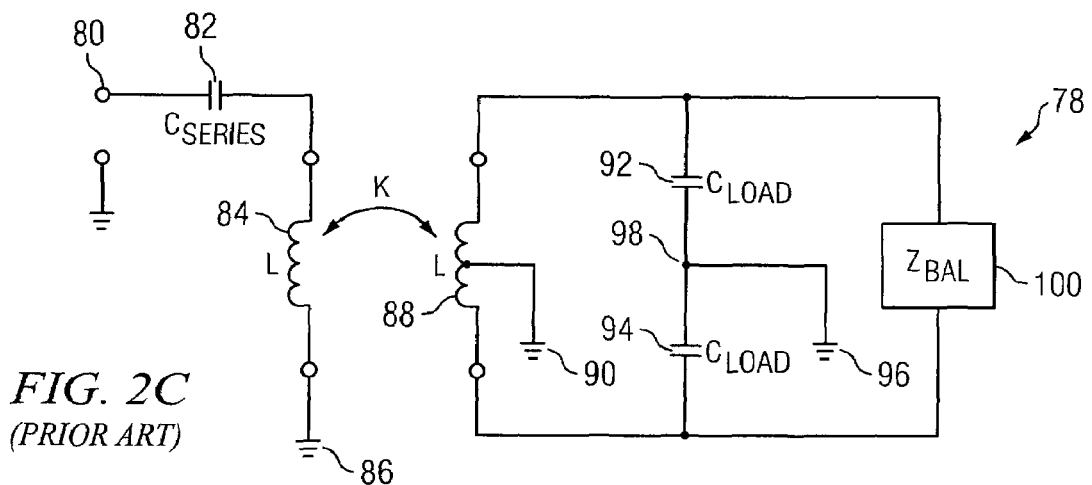
FIG. 2C illustrates a schematic diagram of an additional exemplary prior art balun implementation incorporating loading capacitor devices.

Similarly, in FIG. 2C, an additional exemplary schematic 78 of a balun implementation 78 is shown in a structure similar to the implementation 56 shown in FIG. 2B. Balun 78 again includes an input port 80 connected to a series capacitor 82. Capacitor 82 is coupled to a primary inductor coil 84 which is coupled to ground 86. The secondary inductor coil 88 is again coupled to ground 90 at a center tap. Loading capacitors 92 and 94 are coupled to each output of the secondary inductor coil 88, the capacitors 92 and 94 coupled in parallel with the secondary winding 88. Output terminals of capacitors 92 and 94 are coupled to ground 96 through node 98. Finally, an impedance load 100 (again, such as a LNA 100, PA 100, or another similar active device 100) is placed in parallel with winding 88, and capacitors 92 and 94 as shown.

Figure 2D:
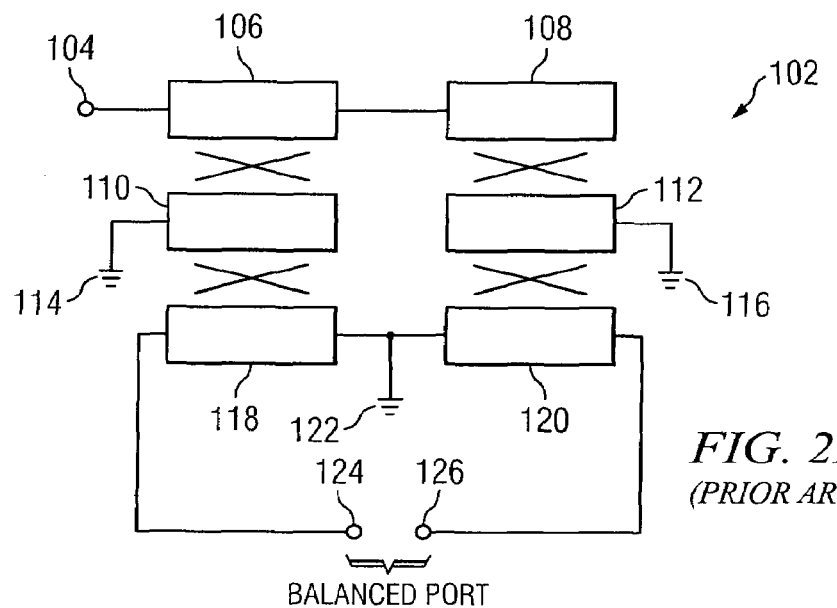
FIG. 2D illustrates an additional exemplary prior art implementation of a prior art balun design incorporating a distributed constant component.

FIG. 2D illustrates an additional balun design 102 utilizing distributed components in a design similar to balun 36 shown in FIG. 2A. Balun 102 includes a series of three sets of distributed line components which are coupled together as shown. An input 104 includes an unbalanced port, coupled to distributed lines components 106 and 108. Components 106 and 108 are coupled to components 110 and 112, which are each coupled to ground 114 and 116 as shown. Components 118 and 120 are coupled to ground 122 as shown at a first end. A second end of each component 118 and 120 are coupled to terminals 124 and 126 of the balanced port.

As previously mentioned, transformer balun implementations such as balun 56 and balun 78 in the prior art make wide-band implementations unpractical due to physical characteristics of the transformer component. In light of the prior art, balun implementations can achieve limited wide-band functionality but at a cost of having a large size. Conversely, balun implementations can achieve a compact design and footprint, but at a cost of drastically limited bandwidth.

As the exemplary implementation 10 in FIG. 1 indicates, a balun 20, or balun 34 can be constructed according to the present invention, to be used in wide-band radio frequency (RF) applications such as implementation 10. The baluns 20 and 34 can be used in RF applications having a wide range of bandwidth (e.g., bandwidths of 800 MHz to 6 GHz), in contrast to the prior art. In one embodiment of the present invention, baluns 20 and 34 can be used in other, customer-requested wide-band applications having bandwidths ranging from 800 MHz to 2100 MHz. In further embodiments, ultra-wideband baluns (UWBs) can be constructed.

In addition to having wide-band frequency characteristics, a balun device 20 can be constructed, again according to the present invention, with an accompanying compact size and footprint.

A series of coil structures can be used for designs of integrated passive devices (IPD), including those of baluns 20 and 34, that use silicon and semiconductor technologies as will be described. Individual coil structures can be combined into a series of integrated coil structures. A series of coil structures can include three, four or more single coil structures, although three single coil structure designs can be preferable in some cases for balun implementations as will be shown. The integrated coil structures form spiral inductor devices which are magnetically coupled together. Beyond the inductive property from a single coil structure, a series of integrated coil structures has an associated mutual inductance which helps to realize a more compact design. In addition, the coil structures are efficient and cost-effective to manufacture.

Figure 3:
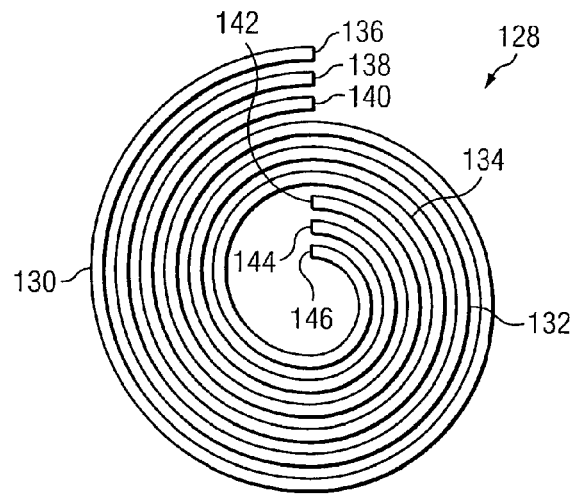
FIG. 3 illustrates an exemplary coil structure.

Turning to FIG. 3, a conceptual diagram of a plurality of coil structures 128 is shown. Three-coil structures are depicted, but again, four, five, or more coil structures can be realized in any given implementation. Coil structures 84, 86, and 88 are formed by depositing metal tube-like structures over a substrate such as silicon or a similar material.

The metal tube-like structures, or "tubes" can be arranged in the round shape as shown. Additionally, the tubes can be configured in other geometrical patterns, such as an octagonal geometrical design, to suit a particular need. The tube structures can have a square, round, or rectangular cross section. In one embodiment, the tube structures are comprised of a copper (Cu) or copper alloy metal material, although additional metals and metal alloy materials can be utilized as required. The tubes can be deposited in a metallization process; accordingly, the tube structures can also be referred to as "metallizations." The coil structures 128 are magnetically coupled to each other. In general, the more bandwidth required for a particular application, the more coil structures 128 can be utilized.

Coils 130, 132, and 134 include respective ends 142, 144, and 146 which can be adapted to provide an electrode-like function. Ends 142, 144, and 146 can be positioned as shown.

Figure 4:
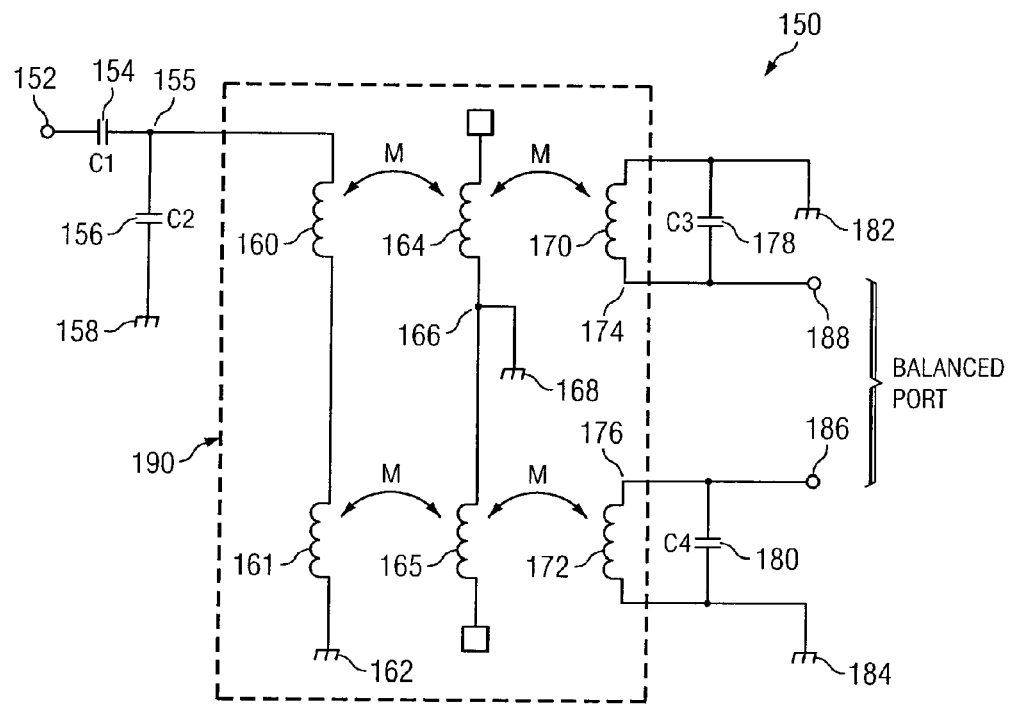
FIG. 4 illustrates a schematic of an exemplary balun device incorporating a series of coil structures.

Turning to FIG. 4, a schematic diagram of a balun device 150 incorporating a plurality of coil structures is depicted. The device 150 consists of four (4) capacitors and three (3) compact coil structures. A first capacitor (C1) is coupled between an input terminal 152 constituting an unbalanced port 152 and an output terminal 155. A shunt capacitor (C2) 156 is shunted between the terminal 155 and ground 158. A first coil is divided into two portions 160 and 161 as shown. Portion 161 is coupled to ground 162. A second coil having portions 164 and 165 is magnetically coupled to the first coil having portions 160 and 161. Portions 164 and 165 terminate at an open circuit. A center tap between the portions 164 and 165 couples the portions 164 and 165 to ground 168.

A third capacitor (C3) 178 is coupled in parallel with portion 170 of the third coil and ground 182. The third coil is broken into two physically separated portions 170 and 172 as shown. Portion 172 terminates at node 176, where a first terminal 186 is coupled. Similarly, portion 170 terminates at node 174, where a second terminal 188 is coupled. Terminals 186 and 188 collectively form a balanced port 186 and 188 for the balun device 150.

In one embodiment, the capacitance of C1 is 4.0 picofarads (pF), while the capacitance of C2 is 1.2 picofarads (pF), and the capacitances of C3 and C4 are 2.6 picofarads (pF). As one skilled in the art would anticipate, however, the various capacitances of the depicted capacitors can be adjusted in any respect to suit a particular application and provide an appropriate electrical response.

Three coupled coils are used to construct a wide-band balun, according to one embodiment of the present invention. Four matching capacitors C1, C2, C3, and C4 are used in the present example to compensate for parasitic capacitance from the physical layouts of the device 150. The respective inductance of the coils and the capacitance of the matching elements can be optimized, based on respective pass-band electrical requirements.

Figure 5:
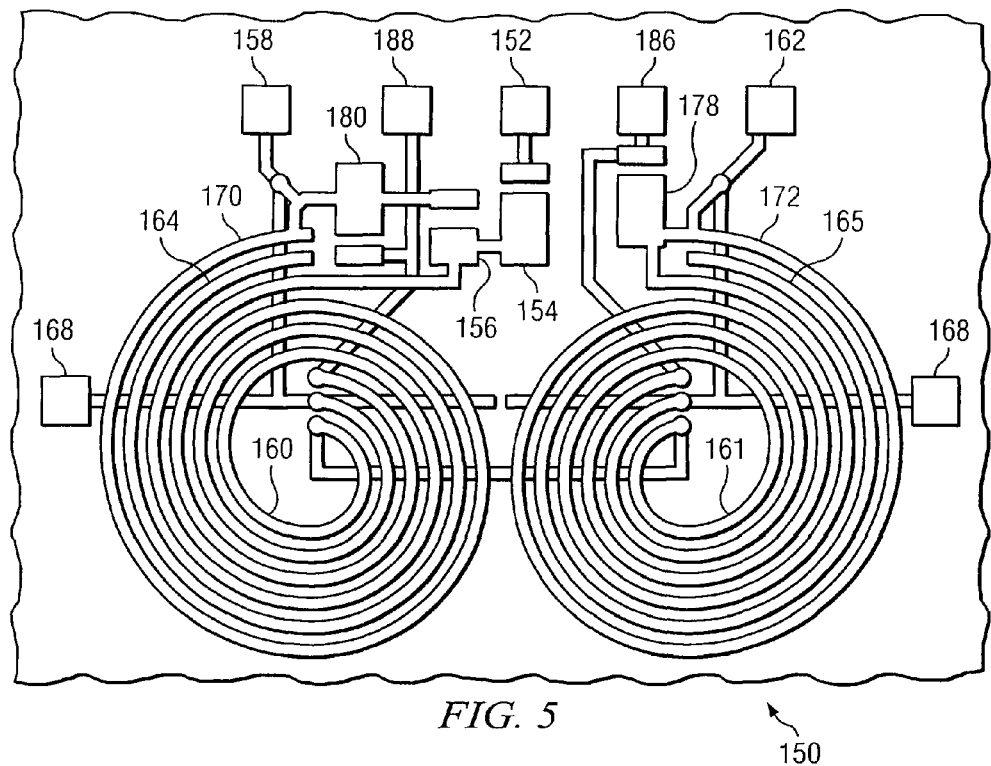
FIG. 5 illustrates an exemplary layout of a balun device incorporating a series of coil structures and a plurality of capacitor devices deposited over a substrate.

FIG. 5 illustrates a balun device 150 incorporating an embodiment of the coil structure of the present invention in a layout view. The various subcomponents depicted share the appropriate figure numbers from FIG. 4, including an unbalanced port 152, capacitor 154, capacitor 156, ground 158 and 162, portion 164, portion 165, center tap 166, ground 168, portion 170, portion 172, capacitor 178, capacitor 180, and balanced port 186 and 188. A portion of second coil portion 165 is disposed interiorly of third coil portion 172 as shown. Similarly, a portion of first coil portion 161 is disposed interiorly to portions 165 and 172. Again, the coil portions 160, 164, and 170, as well as portions 161, 165, and 172, are magnetically coupled.

Coil portions 160, 164, 170, 161, 165, and 172, as well as the various capacitors, leads, and ground structures are deposited over and extend horizontally across a substrate, while maintaining a substantially flat vertical profile. The exemplary device 150 illustrated in FIG. 5 is a wide-band balun device 150 operating at 1.5 GHz-2.2 GHz band, in one embodiment. In another embodiment, the size of the device 150 is approximately 1.6 mm in width×1.0 mm in length× 0.25 mm in height, forming a small footprint and height. The use of round coil portions 160, 164, etc., is used in the present example. A device 150 having the physical size characteristics described constitutes a much smaller device than conventional balun implementations as described in the prior art.

Figure 6:
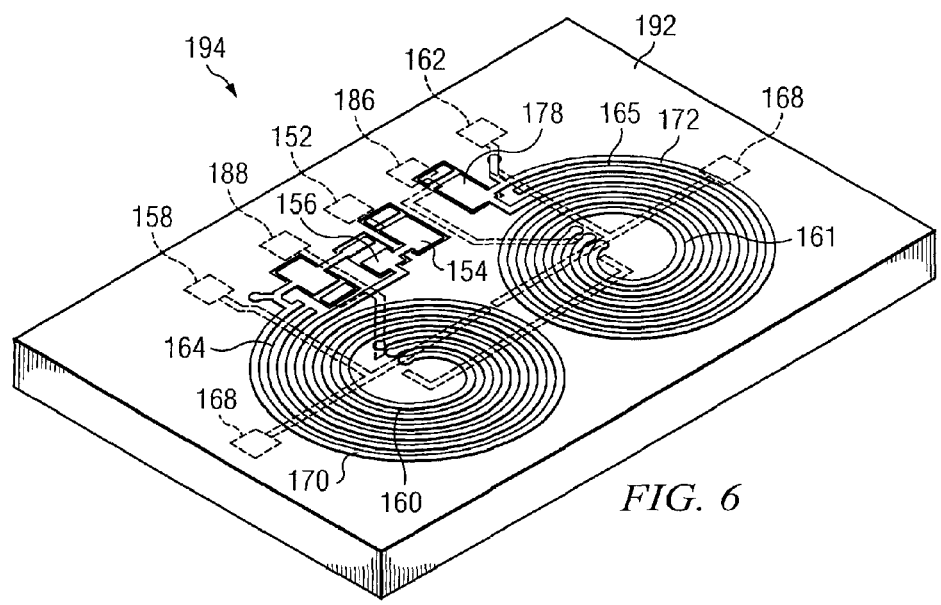
FIG. 6 illustrates the layout depicted in FIG. 5 in a three-dimensional view.

FIG. 6 illustrates the layout shown in FIG. 5 in a three-dimensional view. Here again, the respective figure numbers from FIGS. 4 and 5 are shown. Unbalanced port 152, connecting leads to the various capacitors (e.g., capacitor 180), and unbalanced port with incorporated terminals 186 and 188, are deposited over the substrate 192. Coil portions 160, 164, 170, 161, 165, 172, grounds 168, 162, 168, and the various capacitor structures are deposited over the port terminals 162, 186, and 188 and connecting leads. Coil portions 160, 164, 170, 161, 165, and 172 extend horizontally across substrate 192 as shown. Here again, two groups of three coupled coils are used. A series of wire bonding pads is added for interconnection purposes.

As previously described, coil portions 160, 164, 170, 161, 165, and 172 can form an inductive device which is consistent with other so-called "integrated passive devices" (IPD). A wide variety of the passive devices such as a balun device consistent with the present invention, but also including resistors, capacitors, inductor or filter devices, transceivers, receivers, and other interconnects are placed on a substrate such as substrate 192. The substrate 192 can include silicon, glass, laminate, or ceramic materials.

Integration of a balun device 150 using passive components deposited over a substrate 192 as described results in a high performance system level solution, which provides a significant reduction in die size, weight, number of interconnections and system board space requirements, and can be used for many applications.

A wide variety of balun designs can be constructed which include coil portions 160, 164, 170, 161, 165, and 172 to suit particular applications. The balun designs can be based on differing technologies, including silicon, printed circuit board (PCB) (laminate) or low temperature co-fired ceramic (LTCC) technologies. Again, as a result, substrate 192 can include materials such as silicon or silicon-like materials, laminate materials, glass and ceramic materials.

Coil portions 160, 164, 170, 161, 165, and 172, as well as the overall balun device 150 and accompanying subcomponentry, can be constructed using materials, techniques, and manufacturing equipment known in the art, including various thin-film deposition methods and techniques and incorporating the use of known manufacturing tools and equipment.

Figure 7A:
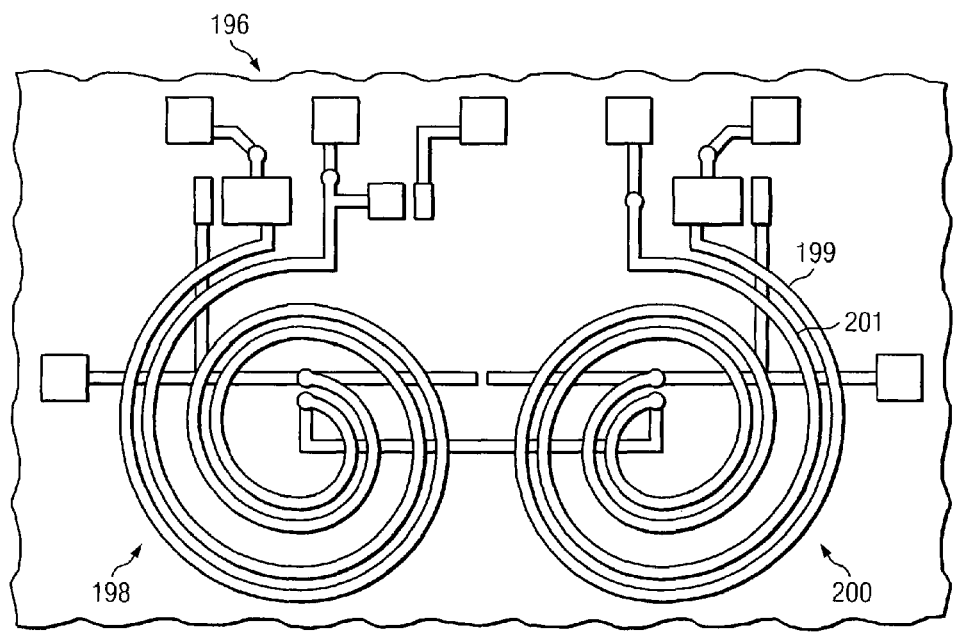
FIG. 7A illustrates an exemplary balun device incorporating a set of two-coils.
Figure 7B:
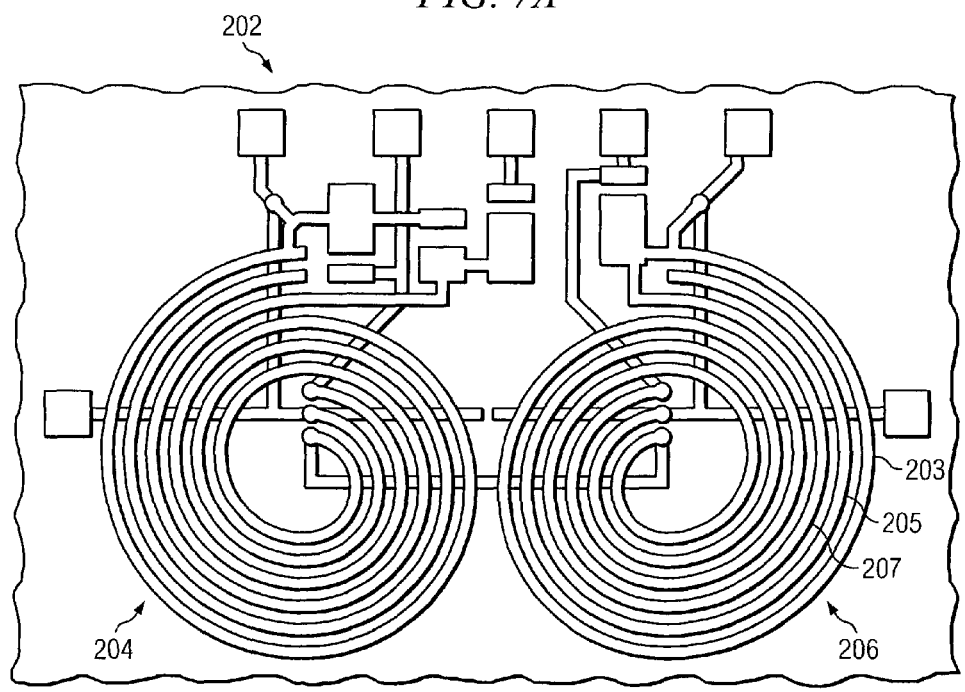
FIG. 7B illustrates a second exemplary balun device incorporating a set of three-coils.

Turning to FIG. 7A, a conceptual illustration of a balun device 196 is depicted. Device 196 includes a set of two coils 199 and 201 which are organized into a group of two-coil structures 198 and 200 as shown. In comparison, FIG. 7B illustrates a conceptual depiction of a balun device 202 having three coils 203, 205, and 207 which are also organized into a group of two-coil structures 204 and 206. For the instant discussion, the balun device 196 is referred to as a "two-coil" balun 196 due to the use of two coils 199 and 201 organized into the groups 198 and 200 shown. Balun device 202 is referred to as a "three-coil" balun 202 due to the use of three coils 203, 205, and 207, also organized into the two groups 204 and 206 as shown.

Figure 7C:
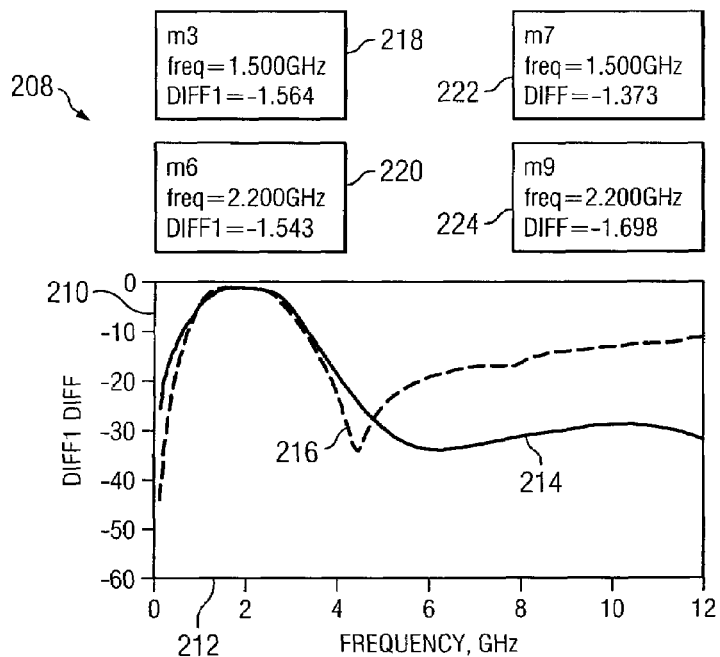
FIG. 7C illustrates an electromagnetic response (EM) of a balun device incorporating a set of two-coils, and incorporating a set of three coils, respectively to show a difference in insertion loss between the balun devices.

An exemplary electromagnetic (EM) response curve which compares the two and three-coil balun devices 196 and 202, respectively, is shown in FIG. 7C. For the present figure, an insertion loss characteristic 208 is compared between the two devices 196 and 202 across a specified range of frequencies 212. Frequencies 212 are measured and denoted in gigahertz, ranging from zero (0) to twelve (12) gigahertz. The difference in insertion loss 210 is expressed as a percentage and denoted along the Y-axis. Insertion loss is shown for device 196 as line 214. Similarly, loss is shown for device 202 as line 216. Various measurements 218 (m3), 220 (m6), 222 (m7), and 224 (m9) confirm that the difference in insertion loss between devices 196 and 202 is minimal (e.g., 1.5-1.7 percent).

Figure 8:
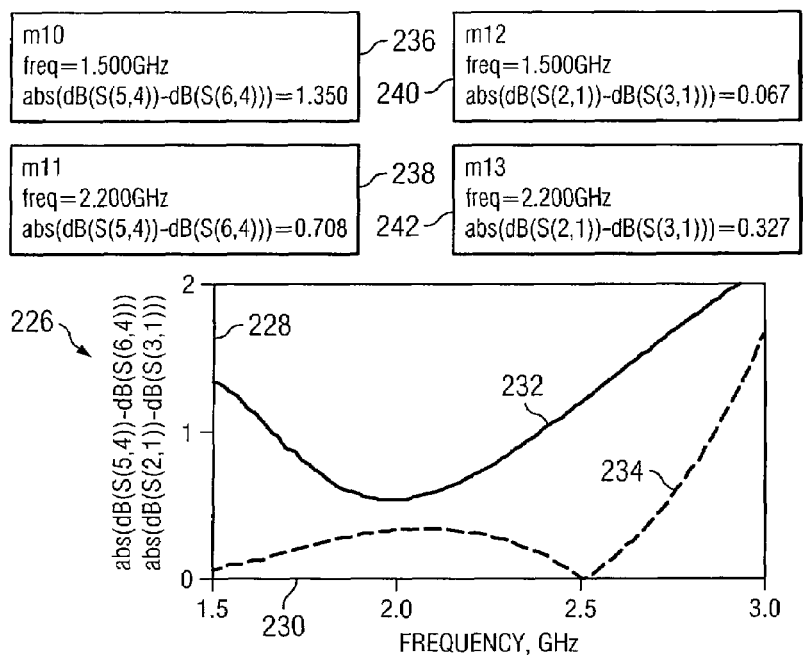
FIG. 8 illustrates an electromagnetic response of the balun device incorporating a set of two-coils, and incorporating a set of three coils, respectively, to show a difference in amplitude imbalance between the balun devices.

FIG. 8 illustrates a second exemplary EM response curve which compares amplitude imbalance 226 of the two devices 196 and 202 across a specified frequency range 230 (again denoted in GHz from 1.5 to 3.0 GHz) to illustrate a specific pass band range for a particular application. The two-coil balun device 196 is represented by line 232; the three-coil balun device is represented by line 234. Relative amplitude 228 is displayed along the Y-axis in dB. Here again, various measurements 236 (m10), 238 (m11), (m12), and (m13) are taken across the denoted frequency range 230. The imbalance of the two-coil balun device 196 exhibits markedly uneven amplitude, starting with approximately 1.30 dB at 1.5 GHz, which tapers but then increases. Conversely, the imbalance of the three-coil balun device 202 is markedly less, beginning with 0.067 dB at 1.5 GHz and continuing along a relatively linear path to 0.327 dB at 2.2 GHz. The respective amplitude imbalance for the three-coil balun 202 is generally less than 0.35 dB. Conversely, the amplitude imbalance for the two-coil balun 196 is greater than 1.35 dB. As a result, the three-coil balun device 202 exhibits wider bandwidth functionality and better amplitude balancing properties.

Figure 9:
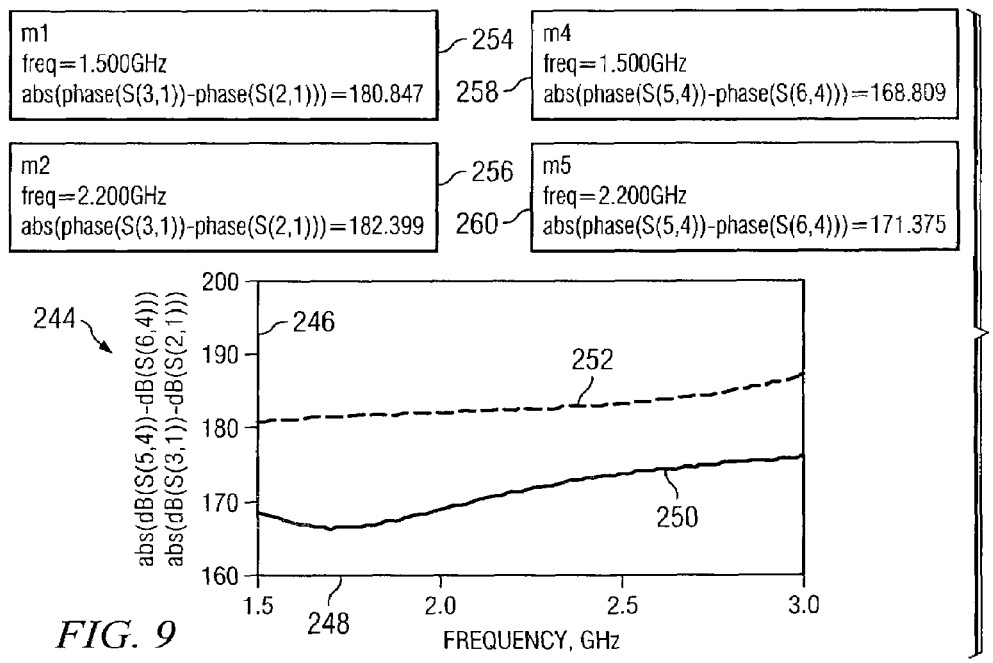
FIG. 9 illustrates an electromagnetic response of the balun device incorporating a set of two-coils, and incorporating a set of three coils, respectively to show a difference in phase imbalance between the balun devices.

FIG. 9 illustrates a third exemplary EM response curve which compares phase imbalance properties 244 of the two devices 196 and 202 across a specified pass band range 248 (1.5 GHz to 2.2 GHz). Phase imbalance 246 is measured in degrees and is shown along the Y-axis. Various measurements 254 (m1), 256 (m2), 258 (m4), and 260 (m5) are denoted. As one skilled in the art will realize, a balun device such as balun device 202 should ideally exhibit a phase differential of 180 degrees from unbalanced port to balanced port.

As shown, the phase imbalance of the two-coil balun device 196 is perceptively much greater than the three-coil balun device 202. For the two-coil device 196, phase imbalance is approximately 11 degrees across the pass band range shown. Conversely, the three-coil device 202 has a respective phase imbalance of approximately 2.5 degrees across the pass band range. As a result, the three-coil device 202 exhibits markedly better phase imbalance properties.

Figure 10A:
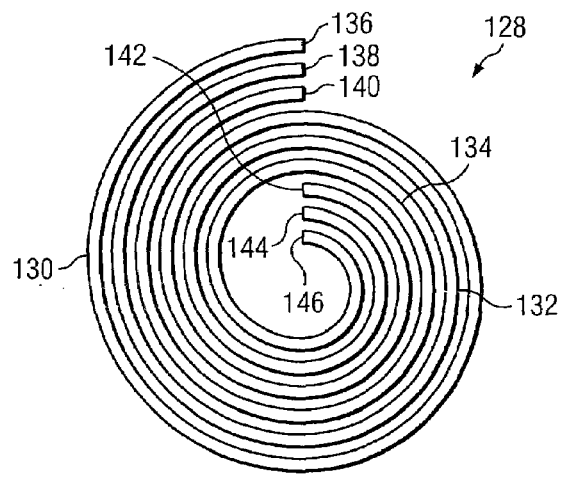
FIGS. 10A and 10B illustrate an exemplary coil structure, including exemplary dimensions.
Figure 10B:
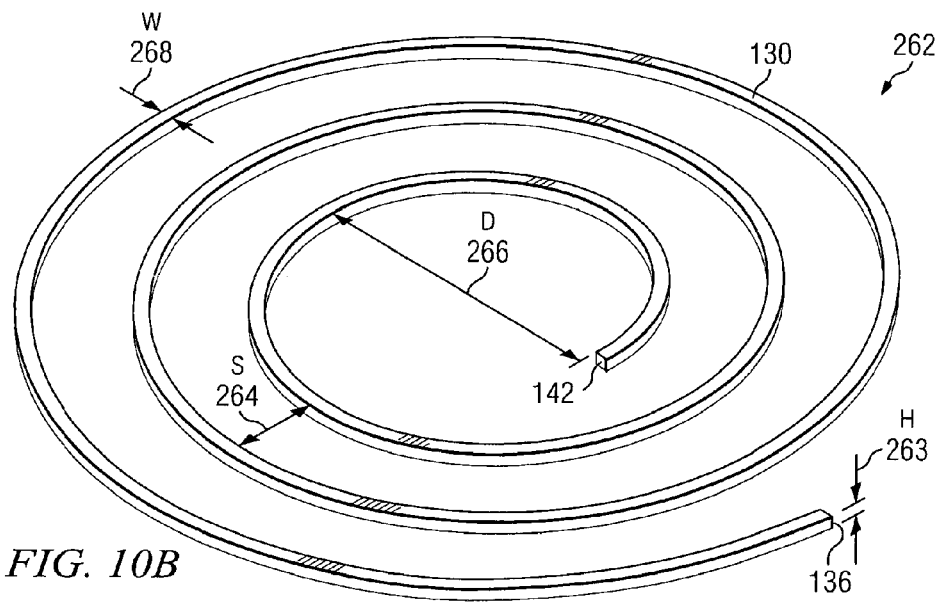

FIGS. 10A and 10B further illustrate the coil structures 128 in a three-dimensional view. Again, coils 130, 132, and 134, having electrodes 142, 144, and 146. FIG. 10B illustrates various dimensional aspects 262 of coil structure 130, including height (H) 263, width (W) 268, coil spacing (S) 264, and inner opening diameter (d) 266.

When an electromagnetic wave interacts with a conductive material, mobile charges within the material are made to oscillate back and forth with the same frequency as the impinging fields. The movement of these charges, usually electrons, constitutes an alternating electric current, the magnitude of which is greatest at the conductor's surface. The decline in current density versus depth is known as the "skin effect."

So-called "skin depth" is a measure of the distance over which the current falls to 1/e of its original value. A gradual change in phase accompanies the change in magnitude, so that, at a given time and at appropriate depths, the current can be flowing in the opposite direction to that at the surface.

The skin depth is a property of the material that varies with the frequency of the applied wave. A respective skin depth can be calculated from the relative permittivity and conductivity of the material and frequency of the wave. First, the material's complex permittivity, $\epsilon_c$ is found such that $$\varepsilon_c = \varepsilon\left(1 - j\frac{\sigma}{\omega\varepsilon}\right) \quad (1)$$

where:
$\epsilon$=permittivity of the material of propagation,
$\omega$=angular frequency of the wave, and
$\sigma$=electrical conductivity of the material of propagation.

In one embodiment, to overcome the skin effect and minimize metal loss, a respective thickness of the coil structures 130, 132, and 134 is maintained to be larger than the respective skin depth.

Again, in one embodiment, copper (Cu) is utilized as a metal material for coil 130. A thickness of eight (8) micrometers exceeds the skin depth for copper (taking into account the electrical conductivity of the copper metal). A thickness greater than five (5) micrometers is recommended, with, again, a preferable thickness of eight (8) micrometers.

The total length of coil 130 is related to the operating frequency of coil 130. In one embodiment, the coil width 268 is twenty (20) micrometers. The coil height 263 is also eight (8) micrometers. The coil spacing 264 is seventy (70) micrometers. The number of turns (T) is two (2). The inner opening diameter 266 is 220 micrometers. Total area is approximately 0.65×0.65=0.42 mm². The estimated inductance for the coil 130 is estimated to be approximately 2.0 nanohenrys (nH) at operating frequency 2.2 gigahertz (GHz).

Again, as one skilled in the art would anticipate, the various dimensions of coil 130, as well as coils 132, and 134, such as width 268 and space 264 can be optimized using tools such as a computer program to suit differing footprint requirements and/or differing specification requirements.

Figure 11:
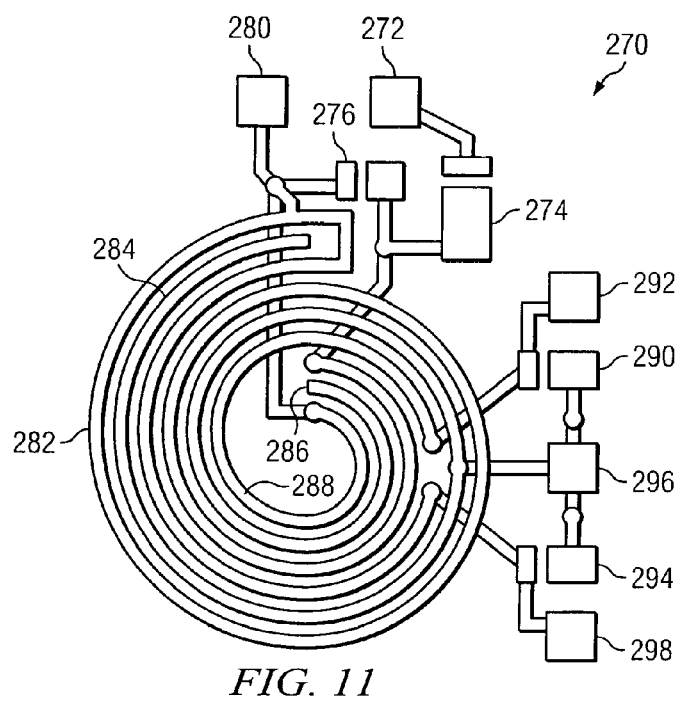
FIG. 11 illustrates an additional exemplary layout of a balun device, where a plurality of metallizations is integrated into a single coil structure.

FIG. 11 illustrates an additional embodiment of a balun device 270 where the various coil structures are integrated and deposited over a substrate in a single group or single configuration as shown. Here, as in FIG. 5, an unbalanced port 272 is configured as shown, and coupled to a first capacitor 274 and a second capacitor 276, which is shunted to a ground pad 280. Coils 282, 284, and 288 are deposited and configured as a single integrated group. A portion of coil 284 lies interior to coil 282. Similarly, a portion of coil 288 lies interior to coil 284.

A portion of coil 284 is left as an open circuit, terminating at location 286 as shown. A portion of coil 288 is coupled to a third capacitor 294 and a fourth capacitor 290, which are both coupled to a ground pad 296 as shown. A first output terminal pad 292 of a balanced port is coupled to capacitor 290 as shown. Similarly, a second output terminal pad 298 is coupled to capacitor 294 as shown.

Figure 12A:
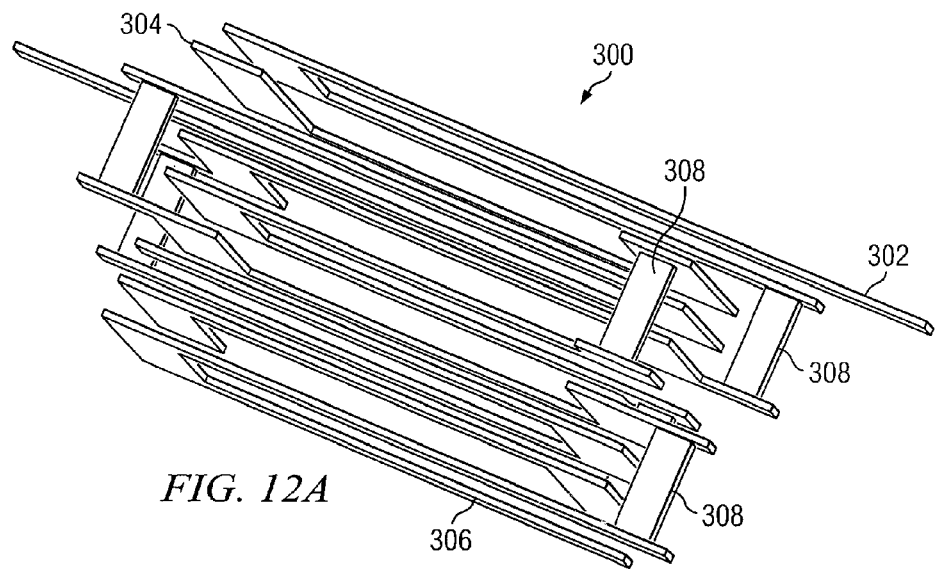
FIG. 12A illustrates an additional exemplary layout of a balun device including a plurality of magnetically coupled layers which can be integrated using PCB or LTCC processes into a semiconductor device.
Figure 12B:
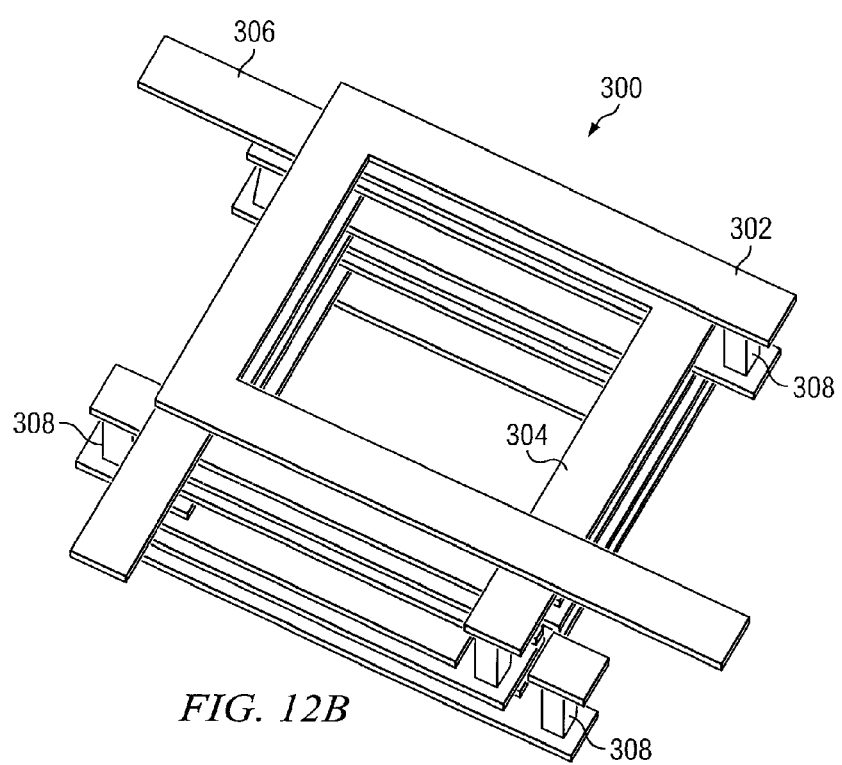
FIG. 12B illustrates an additional view of the layered embodiment depicted in FIG. 12A.

Turning to FIGS. 12A and 12B, an additional, multi-layered embodiment of a coil portion 300 of a balun device is depicted. As FIG. 12A illustrates, three coupled coils 302, 304 and 306 are multi-layered and deposited over a substrate (not shown). Structures 308 are integrated into each of the coils 302, 304, 306 to connect a top layer, for example, of the coil 302 with a bottom layer of the coil 302.

Various technologies such as printed circuit board (PCB) or low temperature co-fired ceramic (LTCC) processes can be implemented to form the layered coil structures 300, as one skilled in the art would expect. FIG. 12B illustrates the layered coil structures 300 in a second view 308.

As FIGS. 12A and 12B indicate, in one embodiment, the layering of the various coils can be configured such that a portion of coil 306 is disposed and/or oriented between a portion of a layer portion of coil 302 and a layer portion of coil 304. Here, as before, the coils can then be connected to other supporting components, such as a balanced port pads (not shown) and capacitor devices, which can also be integrated and configured to coincide with the various layer components of the coils 300. For example, the balanced port pads can be connected to the third coil between portions of the third coil, in a manner similar to that depicted in FIG. 5 or 11. A substrate (not shown), over which the coils 300 are disposed, can again include a silicon, glass, or ceramic substrate for structural support. The coil structures 300 can comprise a portion of a larger overall semiconductor device.

In addition to implementing PCB and LTCC technologies in fabrication processes for coils 300, various structural and packaging technologies such as overmolding compounds and encapsulants can be used to provide additional structural support to the orientation of coils 300, and also support additional discrete components which are integrated over the substrate. Again, various configurations and specifications for the various components can be implemented to suit a particular application. For example, the compact coils 300 can be joined to matching capacitors which have been configured in a variety of series and/or shunt configurations.

Coil structures such as coils 302, 304, and 306 in implementations combined with capacitors such as capacitors 294, connecting leads and bonding pads such as ground pad 280, which are all deposited over a substrate as previously depicted, can provide wide-band balun functionality in a dramatically decreased size and footprint. While one or more embodiments of the present invention have been illustrated in detail, the skilled artisan will appreciate that modifications and adaptations to those embodiments may be made without departing from the scope of the present invention as set forth in the following claims.

What is claimed:

1. A wide-band balun device, comprising:
a first multi-layered coil formed over a substrate in a wound configuration with first, second, and third portions of the first multi-layered coil including a u-shape and being disposed at different levels with the first portion of the first multi-layered coil being disposed at a first level;
a second multi-layered coil formed in a wound configuration with first, second, and third portions of the second multi-layered coil including a u-shape and being disposed at different levels with the first portion of the second multi-layered coil being disposed at a second level over the first level, the first portion of the second multi-layered coil being adjacent and magnetically coupled to the first portion of the first multi-layered coil, the second multi-layered coil being electrically isolated from the first multi-layered coil;
a third multi-layered coil formed in a wound configuration including first, second, and third portions of the third multi-layered coil including a u-shape and being disposed at different levels with the first portion of the third multi-layered coil being disposed at a third level over the second level, the first portion of the third multi-layered coil being adjacent and magnetically coupled to the first portion of the second multi-layered coil, the third multi-layered coil being electrically isolated from the second multi-layered coil; and
the second portion of the first multi-layered coil being disposed at a fourth level over the third level, the second portion of the first multi-layered coil being adjacent and magnetically coupled to the first portion of the third multi-layered coil, the first multi-layered coil being electrically isolated from the third multi-layered coil.

2. The wide-band balun device of claim 1, wherein the substrate includes silicon, glass, or ceramic material for structural support.

3. The wide-band balun device of claim 1, wherein the first, second, and third multi-layered coils have a rectangular cross-section.

4. The wide-band balun device of claim 1, wherein the first, second, and third multi-layered coils include copper or a copper alloy material.

5. The wide-band balun device of claim 1, further including a semiconductor device containing the first, second, and third multi-layered coils.

6. The wide-band balun device of claim 1, wherein a thickness of the first multi-layered coil is greater than a skin depth of the first multi-layered coil to minimize metal loss of the first multi-layered coil and minimize an effect of a decline in current density with respect to the thickness of the first multi-layered coil.

7. The wide-band balun device of claim 1, wherein the wide-band balun device includes dimensions less than 1.6 mm×1.0 mm×0.25 mm and operates at a range of 0.800-6.000 GHz.

8. A balun device, comprising:
a first multi-layered coil formed over a substrate in a wound configuration including a first u-shaped portion;
a second multi-layered coil formed in a wound configuration with a first u-shaped portion of the second multi-layered coil adjacent and magnetically coupled to the first u-shaped portion of the first multi-layered coil, the second multi-layered coil being electrically isolated from the first multi-layered coil;
a third multi-layered coil formed in a wound configuration with a first u-shaped portion of the third multi-layered coil adjacent and magnetically coupled to the first u-shaped portion of the second multi-layered coil, the third multi-layered coil being electrically isolated from the second multi-layered coil; and
a second u-shaped portion of the first multi-layered coil being adjacent and magnetically coupled to the first u-shaped portion of the third multi-layered coil.

9. The balun device of claim 8, further including a semiconductor device containing the first, second, and third multi-layered coils.

10. The balun device of claim 8, wherein the substrate includes silicon, glass, or ceramic material for structural support.

11. The balun device of claim 8, wherein the first, second, and third multi-layered coils have a rectangular cross-section or round cross-section.

12. The balun device of claim 8, wherein the first, second, and third multi-layered coils include nested first, second, and third portions.

13. The balun device of claim 8, wherein the balun device includes dimensions less than 1.6 mm×1.0 mm×0.25 mm and operates at a range of 0.800-6.000 GHz.

14. A balun for a semiconductor device, comprising:
a first multi-layered metallization formed over a substrate including first, second, and third portions disposed at different levels;
a second multi-layered metallization with first, second, and third portions disposed at different levels and the first portion of the second multi-layered metallization being adjacent and magnetically coupled to the first portion of the first multi-layered metallization, the second multi-layered metallization being electrically isolated from the first multi-layered metallization;

a third multi-layered metallization with first, second, and third portions disposed at different levels and the first portion of the third multi-layered metallization disposed adjacent and magnetically coupled to the first portion of the second multi-layered metallization, the third multi-layered metallization being electrically isolated from the second multi-layered metallization; and the second portion of the first multi-layered metallization being adjacent and magnetically coupled to the first portion of the third multi-layered metallization.

15. The balun of claim 14, wherein the substrate includes silicon, glass, or ceramic material for structural support.

16. The balun of claim 14, wherein the first, second, and third multi-layered metallizations include copper or a copper alloy material.

17. The balun of claim 14, wherein the first, second, and third multi-layered metallizations have a rectangular or round cross-section.

18. The balun of claim 14, wherein the first, second, and third portions of the first, second, and third multi-layered metallizations are u-shaped.

19. A method of manufacturing a balun, comprising:

forming a first multi-layered metallization including a first portion of the first multi-layered metallization disposed over a substrate;

forming a second multi-layered metallization with a first portion of the second multi-layered metallization being adjacent and magnetically coupled to the first portion of the first multi-layered metallization, the second multi-layered metallization being electrically isolated from the first multi-layered metallization;

forming a third multi-layered metallization with a first portion of the third multi-layered metallization being adjacent and magnetically coupled to the first portion of the second multi-layered metallization, the third multi-layered metallization being electrically isolated from the second multi-layered metallization; and disposing a second portion of the first multi-layered metallization adjacent and magnetically coupled to the first portion of the third multi-layered metallization.

20. The method of claim 19, wherein the first, second, and third multi-layered metallizations include copper or a copper alloy material.

21. The method of claim 19, wherein the first, second, and third multi-layered metallizations have a rectangular cross-section or round cross-section.

22. The method of claim 19, wherein the substrate includes silicon, glass, or ceramic material for structural support.

23. The method of claim 19, further including forming the first, second, and third multi-layered metallizations on a semiconductor device.

24. The method of claim 19, wherein the first, second, and third multi-layered metallizations include first, second, and third u-shaped portions.

25. The method of claim 19, wherein a thickness of the first, second, and third multi-layered metallizations is greater than a skin depth of the first, second, and third multi-layered metallizations to minimize metal loss and minimize an effect of a decline in current density with respect to the thickness of the first, second, and third multi-layered metallizations.

26. A balun device, comprising:

a first coil including multiple layers formed in a wound configuration at different levels over a substrate;

a second coil including multiple layers formed in a wound configuration at different levels with the multiple layers of the second coil being nested with respect to the multiple layers of the first coil, the second coil being electrically isolated from the first coil; and a third coil formed including multiple layers formed in a wound configuration at different levels with the multiple layers of the third coil being nested with respect to the multiple layers of the first coil and with respect to the multiple layers of the second coil, the third coil being electrically isolated from the second coil.

27. The balun device of claim 26, wherein the substrate includes silicon, glass, or ceramic material for structural support.

28. The balun device of claim 26, wherein the first, second, and third coils have a rectangular cross-section or round cross-section.

29. The balun of claim 26, wherein the first, second, and third coils include copper or a copper alloy material.

30. The balun device of claim 26, wherein the balun device includes dimensions less than 1.6 mm×1.0 mm×0.25 mm and operates at a range of 0.800-6.000 GHz.

31. A method of making a balun device, comprising:

forming a first coil including multiple layers in a wound configuration at different levels over a substrate;

forming a second coil including multiple layers in a wound configuration at different levels with the multiple layers of the second coil being nested with respect to the multiple layers of the first coil, the second coil being electrically isolated from the first coil; and forming a third coil including multiple layers in a wound configuration at different levels with the multiple layers of the third coil being nested with respect to the multiple layers of the first coil and with respect to the multiple layers of the second coil, the third coil being electrically isolated from the second coil.

32. The method of claim 31, wherein the substrate includes silicon, glass, or ceramic material for structural support.

33. The method of claim 31, wherein the first, second, and third coils have a rectangular cross-section or round cross-section.

34. The method of claim 31, wherein the first, second, and third coils include copper or a copper alloy material.

* * * * *